United States Patent [19]
Qin et al.

[11] Patent Number: 5,887,024
[45] Date of Patent: Mar. 23, 1999

[54] MATCHED FILTER

[75] Inventors: Xiaoling Qin; Kunihiko Suzuki; Guoliang Shou; Changming Zhou; Jie Chen, all of Tokyo, Japan

[73] Assignees: Yozan Inc., Tokyo; Sharp Kabushiki Kaisha, Osaka, both of Japan

[21] Appl. No.: 780,145

[22] Filed: Dec. 26, 1996

[30] Foreign Application Priority Data

Dec. 26, 1995 [JP] Japan ...................................... 7-351407
Apr. 12, 1996 [JP] Japan ...................................... 8-115719

[51] Int. Cl.$^6$ ............................ H04B 15/00; H04K 1/00; H04L 27/30
[52] U.S. Cl. ...................... 375/207; 375/343; 364/724.11
[58] Field of Search ..................... 375/207, 343; 364/724.11; 327/91

[56] References Cited

U.S. PATENT DOCUMENTS

| | | | |
|---|---|---|---|
| 4,519,084 | 5/1985 | Langseth | 375/207 |
| 4,808,939 | 2/1989 | Kingston | 375/343 |
| 5,293,398 | 3/1994 | Hamao et al. | 375/343 |
| 5,715,276 | 2/1998 | Tran et al. | 375/207 |

OTHER PUBLICATIONS

Tanaka et al, "Development of Low Power Consumption LSI fo SS Communication", Technical Report of IEICE SST95–77(1995–10) pp. 31–36.

Ogawa et al, "Development of 1 Chip SS Communication LSI Using Digital Matched Filgers" Technical Report of IEICE, ISEC92–42 SST94–65 (1994–12) pp. 33–38.

"Dual 64–TAP, 11 Mcps, Digital Matched Filter/Correlator, Stel–3310" Stanford Telecommunications ASIC & Custom Products Group pp. 126 and 130.

*Primary Examiner*—Chi H. Pham
*Assistant Examiner*—Bryan Webster
*Attorney, Agent, or Firm*—Pillsbury Madison & Sutro, LLP

[57] ABSTRACT

The present invention provides a matched filter which can refresh an entire while keeping the speed of a calculation comparable to a small sized circuit. The first and second addition circuits of a matched filter of the present invention are classified into a plurality of groups, the first and second auxiliary adders replace functions for the groups of the first and second adders respectively. The outputs of the first and second adders are then inputted to the first and second subtractors, respectively, and the refreshing means appropriately refreshes the groups replaced by the first and second auxiliary adders. Further, the present invention decreases the number of auxiliary sapling and holding circuits to be used, and decides the refreshing intervals by considering the change of the voltage caused by leakage and other permissible errors of output voltage.

4 Claims, 10 Drawing Sheets

MATCHED FILTER

FIELD OF THE INVENTION

The present invention relates generally to a matched filter effective for a spread spectrum communication system for such as mobile and person cellular radio and wireless LAN, and in particular to a matched filter including i) a main sampling and holding circuit with a plurality of sampling and holding circuits connected in parallel to an input voltage for holding the input voltage in time series, each sampling and holding circuit having first and second outputs corresponding to first and second values of a PN code, ii) a first adder for adding the first outputs of the sampling and holding circuits, iii) a second adder for adding the second outputs of the sampling and holding circuits, iv) a subtraction circuit for subtracting an output of the second adder from an output of the first adder.

The present invention also relates to a matched filter including an addition and subtraction circuit including subtracter for subtracting an output of the second adder from an output of the first adder in addition to the above.

BACKGROUND OF THE INVENTION

The applicants have proposed a matched filter of this kind of one in Japanese patent application number 7-212438. Paying attention that PN (Pseudo-Noise) code is a 1 bit code, a circuit for multiplication is simplified by a multiplexer.

In such an analog calculating circuit, an offset voltage is generated by a residual electrical charge in an inverter and capacitor. As a result, the accuracy of the output is comprised. In order to reduce the electrical charge, it is necessary to short-circuit the capacitance and allow, for refreshing. As it is necessary to stop the calculation when the circuit is refreshed, the calculation speed of the entire circuit is sacrificed for the sake of accuracy.

Therefore, the applicants of this invention propose the structure in Japanese patent application 7-263573 where a main sampling and holding circuit used as a sampling and holding circuit of a matched filter and a sampling and holding circuit are settled, and holding data is once held in a supplemental sampling and holding circuit when the main sampling and holding circuit is refreshed. However it is requested to reduce further the size of the circuit and consuming electric power.

SUMMARY OF THE INVENTION

The present invention solves the above problems and has an object to provide a matched filter which can refresh entire circuit while keeping the speed of a calculation commensurate with a small-sized circuit.

The first and second addition circuits of a matched filter of the present invention are separated into a plurality of groups, the first and second auxiliary adders are designated for replacing functions of groups of the first and second adders, respectively, outputs of the first and second adders are input to the first and second subtractors, respectively, the refreshing means appropriately refreshes groups replaced by the first and second auxiliary adders.

Further, the present invention decreases the number of auxiliary sampling and holding circuits to be used, and decides the refreshing intervals by considering the change in voltage caused by leakage as well as other permissible errors of output voltage.

PREFERRED EMBODIMENT OF THE PRESENT INVENTION

Hereinafter the first embodiment of a matched filter according to the present invention is described with reference to the attached drawings.

Figure 1:
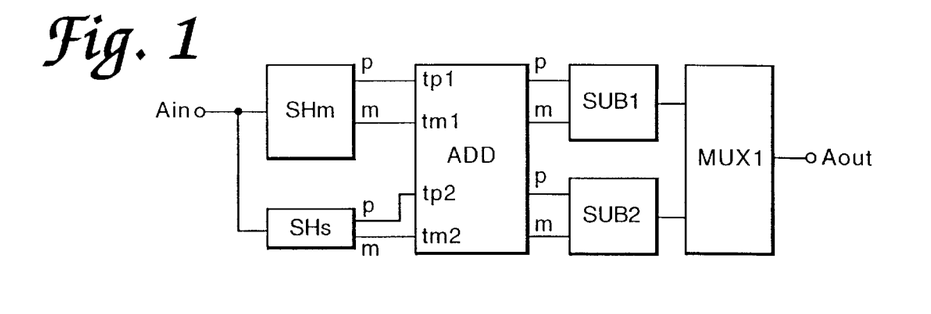
FIG. 1 shows a block diagram of a matched filter of the first embodiment according to the present invention.
Figure 17:
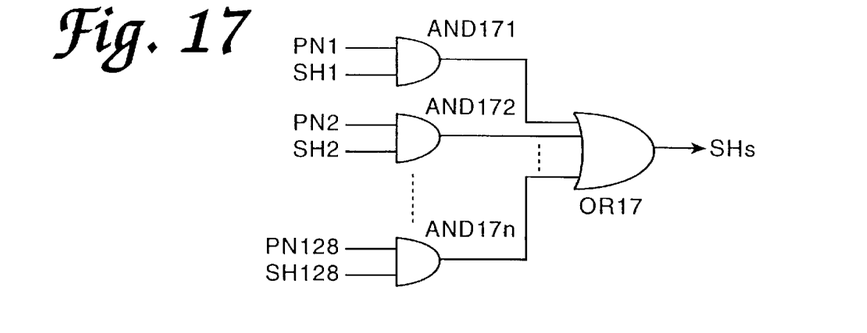
FIG. 17 shows a circuit for generating a sampling and holding signal of a main sampling and holding circuit.

In FIG. 1, a matched filter includes auxiliary sampling and holding circuits SHs in addition to a main sampling and holding circuit SHm which is similar to a conventional sampling and holding circuit (with a plurality of S/Hs in FIG. 17). The auxiliary sampling and holding circuits have the function of surrogately holding data to be subsequently held in the main sampling and holding circuit. That is, an auxiliary sampling and holding circuit can be used instead of one of the circuits in the main sampling and holding circuit. Therefore, it is possible to sequentially stop sampling and holding circuits one after another in the main sampling and holding circuit.

Outputs of the sampling and holding circuits in the main sampling and holding circuit SHm and SHs are inputted to the first addition circuit ADD. The addition circuit performs addition with respect to outputs of both plus and minus. In FIG. 1, outputs of plus and minus of SHm and SHs are shown by p and m. An output of the addition circuit ADD is inputted in parallel fashion to the first subtraction SUB1 and the second subtraction SUB2. Which then feeds into a multiplexer MUX1 and appears as an analog output voltage Aout.

Figure 19:
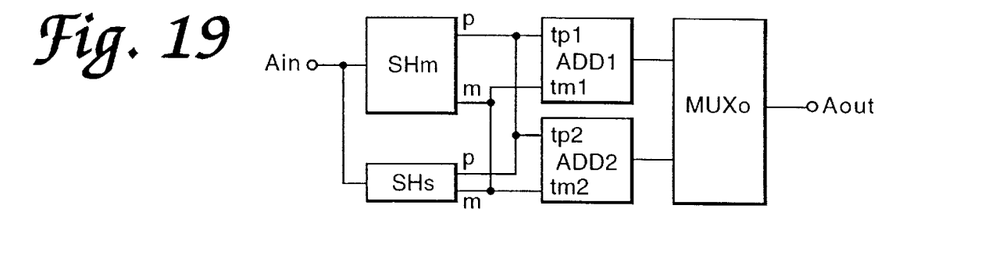
FIG. 19 shows a block diagram of the second embodiment of a matched filter circuit according to the present invention.

In FIG. 19, outputs of sampling and holding circuits SHm and SHs are input to the first addition and subtraction circuit ADD1 and the second addition and subtraction circuit ADD2. These addition and subtraction circuits perform addition and subtraction with respect to outputs of both plus and minus. In FIG. 1, outputs of plus and minus of SHm and SHs are shown by p and m. One of the two addition and subtraction circuits can be stopped when two of addition and subtraction circuits are settled. Then outputs of addition and subtraction circuits ADD1 and ADD2 are alternatively outputted from a multiplexer MUXo as an analog outputted voltage Aout.

Figure 2:
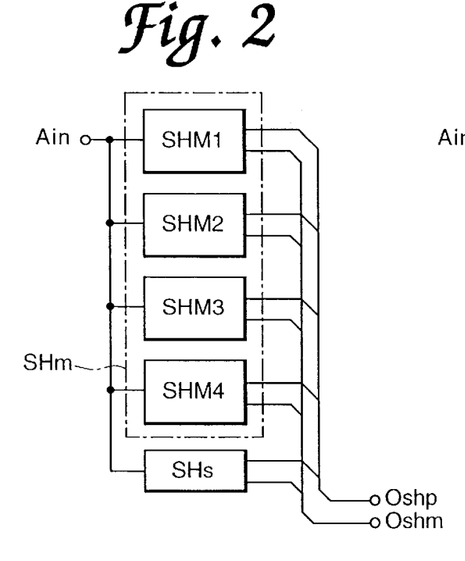
FIG. 2 show a block diagram of a sampling and holding circuit of the embodiment in FIG. 1.

FIG. 2 shows the main sampling and holding circuit SHm in detail, in which auxiliary sampling and holding circuits are also shown. The main sampling and holding circuit SHm includes four sampling and holding circuit modules SHM1, SHM2, SHM3 and SHM4. These sampling and holding circuits generate two kinds of outputs of p and m according to the PN code to be multiplied to the held data. Outputs of SHs and SHm are input to ADD1 and ADD2, respectively, by integrating outputs of p and m by each group. The plus element and a minus element are defined as Oshp and Oshm, respectively. An input terminal of a plus element and a minus element of ADD for inputting to SHm are tp1 and tm1, respectively, and those for inputting SHs are tp 2 and tm2, respectively. As outputs of the main sampling and holding circuit SHm and auxiliary sampling and holding circuit SHs are input to the addition circuit ADD after integrating them by each group, an effective output Aout (FIG. 1) can be generated when one of addition circuits works.

An input terminal of a plus component and a minus component of ADD1 are tp1 and tm1, respectively, and those of ADD2 are tp 2 and tm2, respectively. As outputs of the main sampling and holding circuit SHm and auxiliary sampling and holding circuit SHs are integrated for plus and minus and input to both of the addition and subtraction circuits ADD1 and ADD2, an effective output Aout (FIG. 19) can be generated when one of addition and subtraction circuits works.

Figure 3:
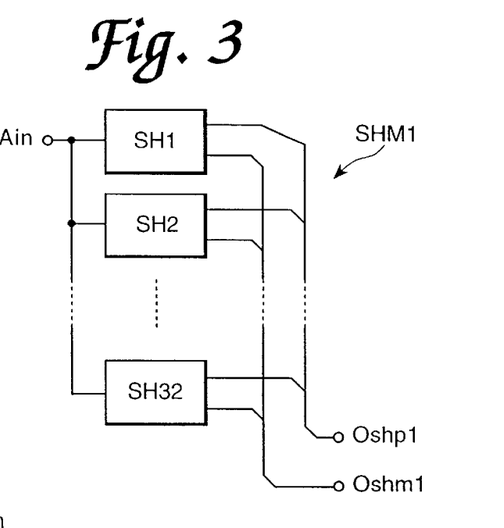
FIG. 3 shows a block diagram of the main sampling and holding circuit of the embodiment in FIG. 1.

FIG. 3 illustrates a sampling and holding circuit module for each of the holding circuits SH1 to SH32 and, consequently, it is therefore possible to hold a 128 data for SHm (32×4=128). Because SHM2 to SHM4 are structure identically as that of SHM1, the description of them is omitted.

Figure 4:
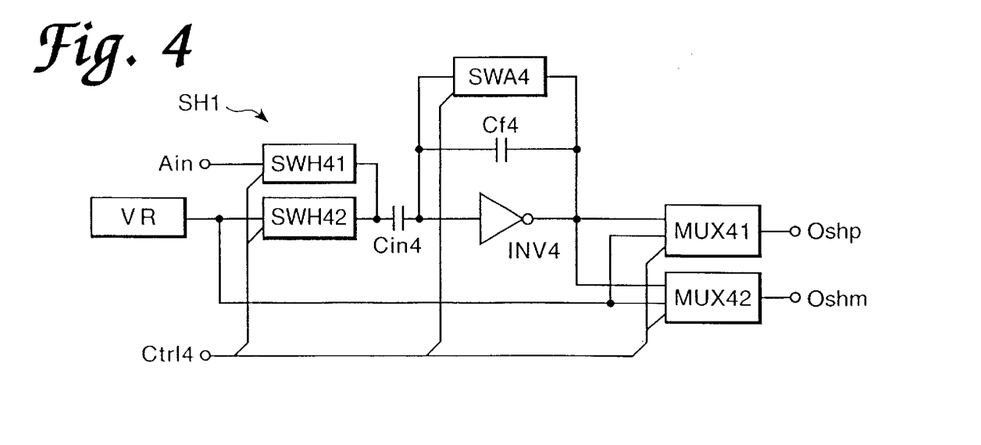
FIG. 4 shows a unit sampling and holding circuit of the main sampling and holding circuit in FIG. 3.

As in FIG. 4, an unit sampling and holding circuit SH1 includes an input switch SWH41 connected to the input voltage Ain and an input capacitance Cin4 connected to the input switch. The input capacitance is inputted to an inverter INV4 including three stages of serial MOS inverts. An output of the INV4 is fed back to its input through feedback capacitance Cf4. The linearity of the relationship between an input and output is strictly maintained by a high open loop gain of INV4. INV4 obtains high gain by three stages of MOS inverts, and prevents unnecessary oscillation by a grounded capacitance and a balancing resistance. When data is held by virtue of sampling and holding circuit, opening SWH41 after closing, holding an electric charge in capacitances Cin4 and Cf4, and an input voltage Ain is output from the output of INV4. The ratio of the capacity of capacitances Cin4 and Cf4 is 1:1, and an inverse of Ain is output from INV4. To the output of INV4, multiplexers MUX41 and MUX42 are connected, which correspond to Oshp and Oshm. Only one of the multiplexers outputs Ain and the other outputs the reference voltage. The reference voltage is the reference of the output voltage, which corresponds to 0.

The unit sampling and holding circuit SH1 includes switches for refreshing SWH42 and SWA4, which are controlled by a control signal Ctrl4. Multiplexers MUX41 to MUX42 are also controlled by the Ctrl4. SWH42 is used to connect VR to Cin4 and SWA4 is used for short-circuiting the input and output of INV4. SH1 is refreshed and the offset is canceled by closing the switches. Because SH1 cannot hold and output Ain during refreshing. Shs is used in place of it. When refreshing is performed, MUX41 to MUX42 are settled to output the reference voltage and output the reference voltage to ADD and to addition and subtraction circuit.

Because SH2 to SH32 are structured same as that of SH1, the description of SH2–SH32 is omitted.

Figure 5:
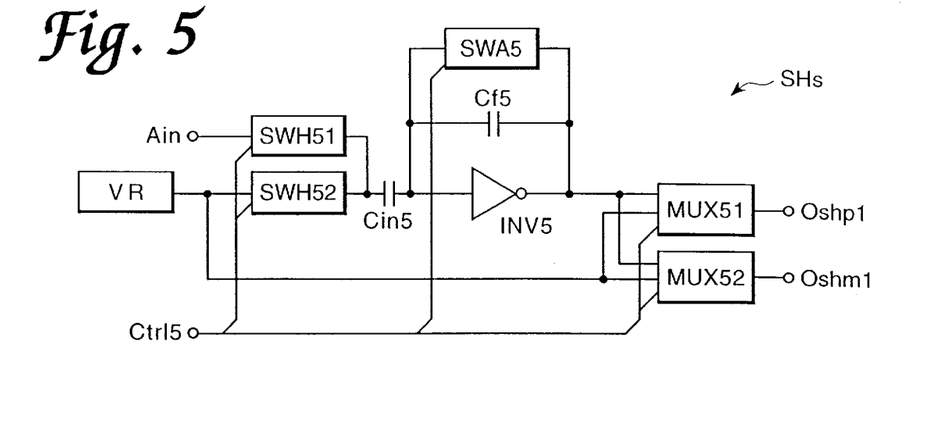
FIG. 5 shows an auxiliary sampling and holding circuit in the embodiment.

As in FIG. 5, auxiliary sampling and holding circuit SHs is a circuit similar to the unit sampling and holding circuit. In FIG. 5, SWH51 is a switch for connecting the Ain to an input capacitance Cin5, SWH52 is a switch for connecting VR to Cin5, INV5 is a three stage of MOS inverter circuit connected to Cin5, Cf5 is a feedback capacitor for feeding back an output of INV5 to its input, SWA5 is a switch for short-circuiting the input and output of INV5, MUX51 is a multiplexer for outputting an output of INV5 as Oshp1, and MUX52 is a multiplexer for outputting an output of INV5 as Oshm1. The ratio of the capacitances of Cin5 and Cf5 is 1:1. The inverse of Ain is output from INV5 as it is.

Switches SWH51, SWH52, SWA5, MUX51 and MUX52 are controlled by a control signal Ctrl5. When the refresh is performed, SWH51 is opened, SWH52 is closed, SWA5 is closed, and MUX51 and MUX52 are settled for outputting the reference voltage. The offset voltage is reduced and the addition circuit ADD output is the reference voltage.

Figure 6:
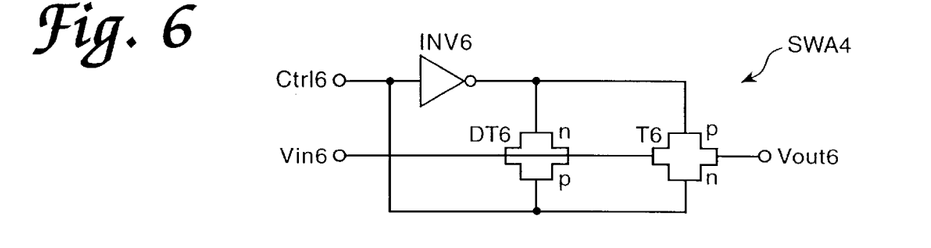
FIG. 6 shows a circuit of a switch.

In FIG. 6, the switch SWA4 (in FIG. 4) switches a transistor circuit T6 which consists of pMOS and nMOS drain and source which are connected to each other. For example, the source of pMOS and drain of nMOS are connected to each other, by a control signal Ctrl6. An input voltage Vin6 is connected to the drain of pMOS of T6 through a dummy transistor DT6. Ctrl6 is inputted to gates of nMOS of T6 and nMOS of DT6, as well as to gates of pMOS of T6 and nMOS of DT6 through an inverter INV6. T6 is closed when Ctrl6 is at a high level. DT6 consists of MOSs connected in a parallel and with an inverse polarity of T6. It cancels the offset of Cin4 and therefore the output of Vout6 is more accurate. Because SWA5 is the same as SWA4, the description of SWA5 is omitted.

Figure 7:
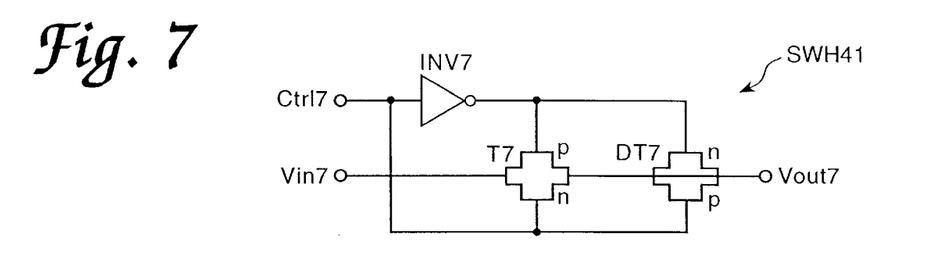
FIG. 7 shows a circuit of another switch.

In FIG. 7, a switch SWH41 (also shown in FIG. 4) is configured by inverting the arrangement of the transistor and dummy transistor in SWA4, in order to cancel the offset of the output. T7 is a MOS switch in which nMOS and pMOS are connected in parallel to the input voltage Vin7, DT7 is a dummy transistor for outputting an inverse polarity of MOS of T7 to an output of T7, INV7 is an inverter for inputting a control signal Ctrl7 to a pMOS of T7 and nMOS of DT7. Because switches SWH42, SWH51 and SWH52 are the same as switch SWH41, the description of said switches is omitted.

Figure 8:
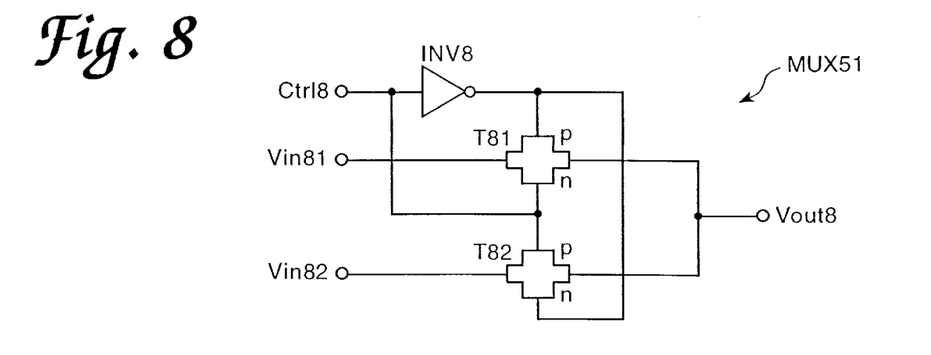
FIG. 8 shows a circuit of a multiplexer.

In FIG. 8, a multiplexer MUX51 (also shown in FIG. 5) switches because two parallel MOS switches by applying a control signal and its inverse to MOS switches T81 and T82. pMOS and nMOS are settled in parallel to input voltages Vin81 and Vin 82. A control signal Ctrl 8 is inputted to the nMOS gate of T81 and the pMOS gate of T82 while an inverse control signal is applied to the pMOS gate of T81 and the nMOS gate of T82. When Ctrl8 is at a high level, T81 is at a closed, and when it is low level, T82 is closed. A Vin81 or Vin82 is outputted as output Vout. Because multiplexers MUX1, MUX41, MUX42 and MUX52 are the same as MUX51, their description is omitted.

Figure 9:
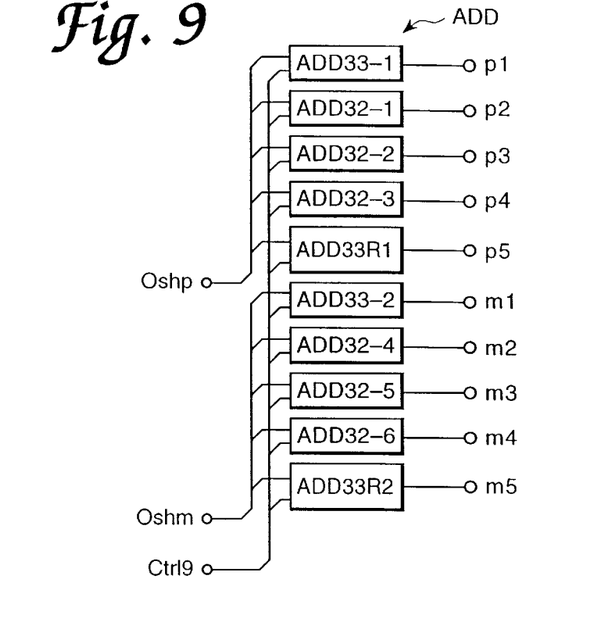
FIG. 9 shows a block diagram of an addition and subtraction means.

In FIG. 9, the addition means ADD (shown in FIG. 1) includes five addition portions ADD33-1, ADD32-1, ADD32-2, ADD32-3 and ADD33R1 for adding Oshp which is outputted from SHm and SHs, and also includes five addition portions ADD33-2, ADD32-4, ADD32-5, ADD32-6 and ADD33R2 for adding Oshm. Addition portions ADD33-1 and ADD33-2 are the addition portion for 33 inputs, and add plus and minus outputs of SHM1 and SHs. ADD32-1, ADD32-2 and ADD32-3 are addition portions of 32 inputs, which add plus outputs of SHM2, SHM3 and SHM4, ADD32-4, ADD32-5 and ADD32-6 are addition portions of 32 inputs, which add minus outputs of SHM2, SHM3 and SHM4.

The addition portion or first auxiliary adder circuit ADD33R1 is being structured similar to ADD33-1. When one of the addition portions ADD33-1, ADD32-1, ADD32-2 and ADD32-3 is refreshed, the ADD33R1 works in place of it. While addition portions ADD33-1, ADD32-1, ADD32-2 and ADD32-3 are successively refreshed, the data to be processed in the addition portion currently being refreshed is inputted to the ADD33R1. The addition portion or second auxiliary adder circuit ADD33R2 is structured similar to the ADD33-2. When one of ADD33-2, ADD32-4, ADD32-5 and ADD32-6 is being refreshed, the ADD33R2 works in place of it. While addition portion ADD33-2, ADD32-4, ADD32-5 and ADD32-6 are successively refreshed, the data to be processed in the refreshed addition portion is inputted to the ADD33R2. The outputs p1, p2, p3, p4 and p5 of ADD33-1, ADD32-1, ADD32-2, ADD32-3 and ADD33R1, respectively and, outputs m1, m2, m3, m4 and m5 of outputs ADD33-2, ADD32-4, ADD32-5, ADD32-6 and ADD33R2, respectively, inputter in parallel fashion input to subtractors SUB1 and SUB2. The pausing and refreshing of each addition portion is controlled by a controlling signal Ctrl9. Multiplexers MUX41 and MUX42 (FIG. 4) corresponding to the sampling and holding circuit SHm, and multiplexers MUX51 and MUX52 (FIG. 5) corresponding to the sampling and holding circuit SHs, are controlled so as to output the reference voltage.

Figure 20:
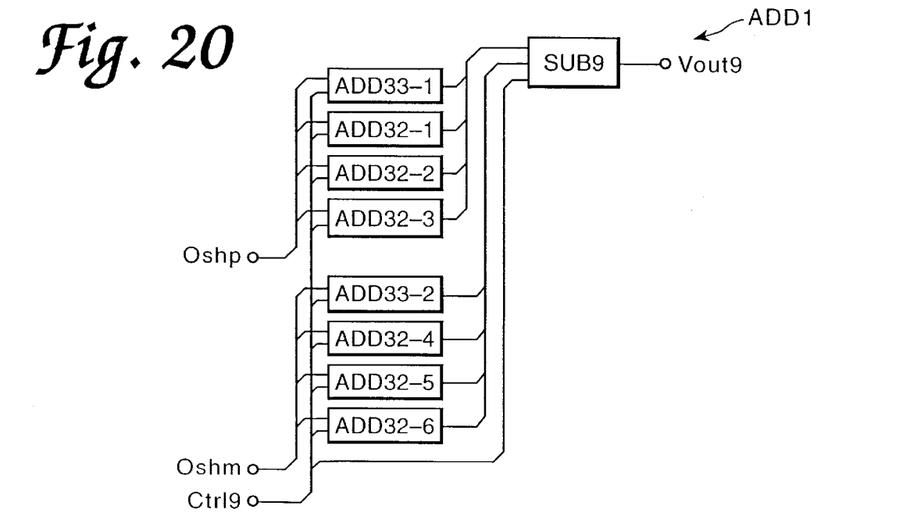
FIG. 20 shows a block diagram of an addition and subtraction means.

In FIG. 20, the addition and subtraction means ADD1 (shown in FIG. 19) includes four addition portions ADD33-1, ADD32-1, ADD32-2 and ADD32-3 for adding Oshp, and also includes four addition portions ADD33-2, ADD32-4, ADD32-5 and ADD32-6 for adding Oshm. Addition portions ADD33-1 and ADD33-2 are the addition portion for 33 inputs, and add plus and minus outputs of SHM1 and SHs. ADD32-1, ADD32-2 and ADD32-3 are addition portions of 32 inputs, which add plus outputs of SHM2, SHM3 and SHM4, ADD32-4, ADD32-5 and ADD32-6 are addition portions of 32 inputs, which add minus outputs of SHM2, SHM3 and SHM4. Addition results of Oshp and Oshm are input to SUB9, and the addition result of Oshm is subtracted from that of Oshp. The stop and refreshment of addition and subtraction means ADD1 is controlled by a control signal Ctrl9 in order that the multiplexers MUX41 and MUX42 (shown in FIG. 4) in the sampling and holding circuit SHm, and the MUX51 and MUX52 (shown in FIG. 5) in the SHs, corresponding to MUX41 and MUX42, respectively, output the reference voltage. Therefore, all the outputs of addition circuits, that is all the inputs of subtraction circuits, are the reference voltage, then the addition and subtraction circuit ADD1 outputs the reference voltage as Vout9. Because ADD2 is the same as ADD1, the description is omitted.

Figures 10, 11:
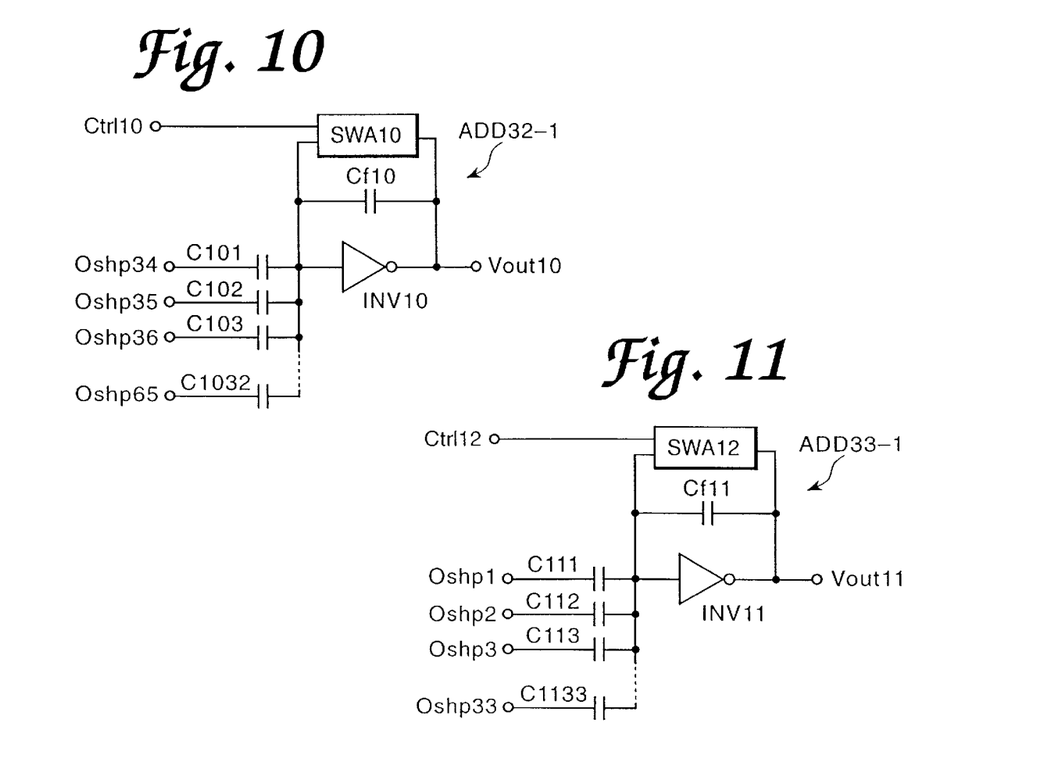
FIG. 10 shows a circuit of an addition portion.
FIG. 11 shows a circuit of another addition circuit.

In FIG. 10, ADD32-1 includes capacitive coupling in which 32 capacitors from C101 to C1032 are connected in parallel to inverter circuit INV10. These capacitors have the same capacitance as ADD32-1. The inverter circuit INV10 consists of a three stage MOS inverter. An output of iNV10 is fed back to its input by a feed capacitor Cf10, and is outputted as an output Vout10 which is an inverted output of the capacitive coupling with good linearity. The capacitance ratio of capacitors C101 to C1032 and Cf10 is 1:32. For example when an input voltage is equally impressed to C101 to C1032, the INV10 outputs a voltage equal to the input voltage. Also a switch SWA10 (the structure is the same as SWA4) for short-circuiting an input and output is connected to INV10, and refreshes ADD32-1 when the INV10 is closed by a control signal Ctrl10. When this refreshment is performed, all the inputs of the addition circuit become the reference voltage. Accordingly, the output Vout10 becomes the reference voltage by short-circuiting the input and output of the inverter INV10. Because ADD32-2 to ADD32-6 are the same as ADD32-1, the description is omitted.

In FIG. 11, ADD33-1 includes a capacitive coupling in which 33 capacitors from C111 to C1133 are connected in parallel with the same capacitance as ADD33-1. An output of the capacitive coupling is connected to an inverter circuit INV11 which consists of a three-stage MOS inverter. An output of INV11 is fed back to its input by a feedback capacitance Cf11, and is outputter as an output Vout11 which is an inverted output of the capacitive coupling with good linearity. The capacitance ratio of capacitors C111 to C1133 and Cf11 is 1:32. ADD33-1 has the same weight as ADD32-1. If an invalid input (the reference voltage) is inputted to one of the capacitors C111 and C1133, the ratio is settled with ignoring one of input capacitances.

For example, when the same voltage is impressed to C111 to C1133, the INV11 outputs a voltage equivalent to the input voltage. Furthermore, when the reference voltage is impressed to one of C111 to C1133 and an input voltage other than the reference voltage, is impressed to others, the INV11 outputs an inverted voltage of the input voltage. Also, switch SWA11 (the structure is the same as SWA4) for short-circuiting an input and output is connected to INV11, and refreshes ADD33-1 when the INV11 is closed by a control signal Ctrl11. As mentioned before, all the addition portions inputs become the reference voltage when a refreshing operation is performed, therefore, Vout11 is the reference voltage by short-circuiting the input and output of the inverters INV11. Because ADD32-2 is the same as ADD32-1, the description is omitted.

Figure 12:
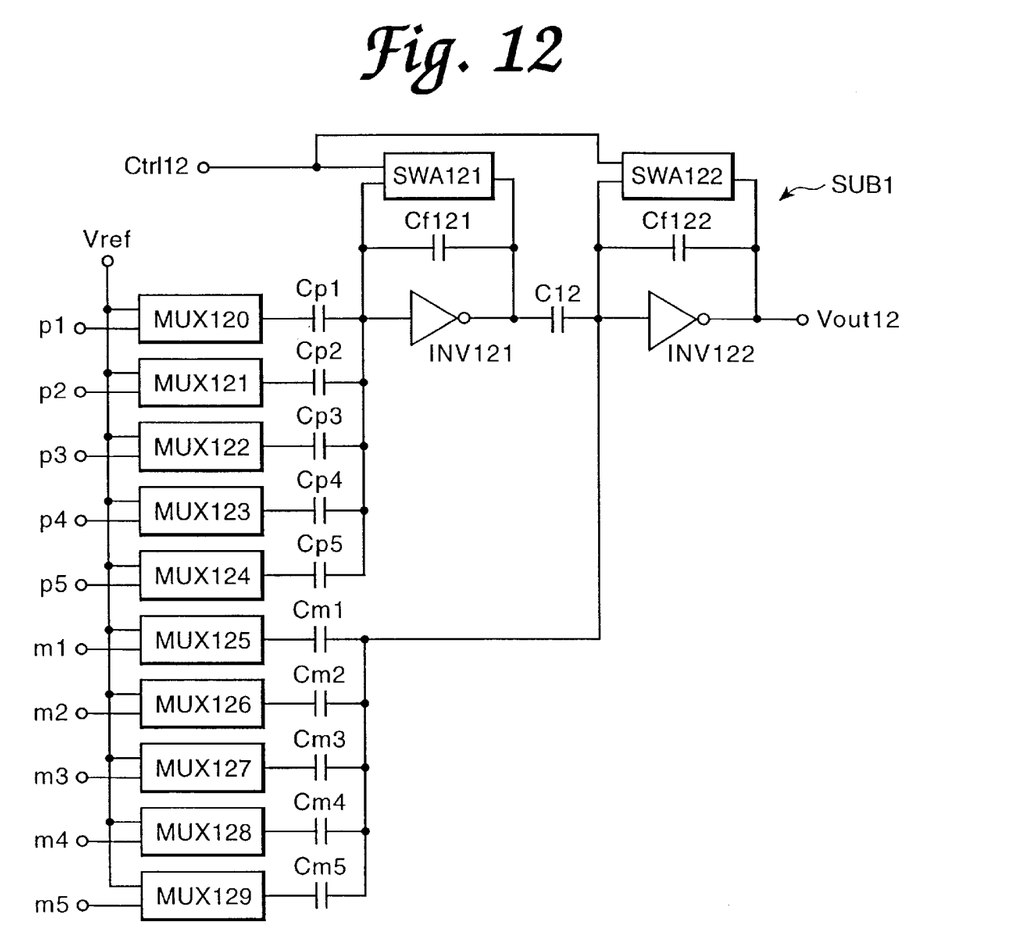
FIG. 12 shows a circuit of a subtraction circuit.

In FIG. 12, the subtracter SUB9 includes capacitive coupling with capacitors Cp1, Cp2, Cp3, Cp4 for adding outputs of ADD33-1, ADD32-1, ADD32-2 and ADD32-3 (shown by p1, p2, p3 and p4 in the figure). An output of the capacitive coupling is connected to an inverter circuit INV121 consisting of a three-stage MOS inverter. An output of INV121 is fed back to its input by a feedback capacitance Cf121, for good linearity. An inverter circuit INV122, similar to INV121, is connected to the following stage to the iNV122 through a capacitance C12. The capacitive coupling consisting of capacitances Cm1, Cm2, Cm3 and Cm4 is connected to INV122. A feedback capacitance Cf122 is also connected to INV122. Minus outputs of ADD32-2, ADD32-4, ADD32-5 and ADD32-6 (shown by m1, m2, m3 and m4) are inputted to the capacitances, and their addition results are outputted. The output of INV121 is the inverse of addition result of the p1 to p4. INV121 is added to the summation of m1 to m4 in C12 and the capacitive coupling including Cm1 to Cm4. As the addition result is inverted by INV122, the value subtracted the addition result of m1 to m4 from the addition result of p1 to p4 is generated as Vout12 of the output of INV122. The ratio of the capacitance of each capacitor Cp1 to Cp4 and of Cf122 is 1:4. For example, when equal input voltage is impressed to Cp1 to Cp4, INV121 outputs the voltage equal to each input voltage. The capacitor ratio of each capacitance of Cm1 to Cm4, C12, and Cf122 is 1:4:4. Inputs of Cp1 to Cp4 and of Cm1 to Cm4 are equally weighted. For example, when all inputs have the same value of plus, the last output Vout12 is equal to the input. On the other hand, when they have the same value of minus, Vout12 is inverted on the axis of the reference voltage. INV121 and INV122 are connected by switches for refreshing SWA121 and SWA122, and controlled by a control signal Ctrl12.

Multiplexers MUX120, MUX121, MUX122, MUX123 and MUX124 similar to the multiplexer MUX51 and are connected to inputs of Cp1, CP2, Cp3, Cp4 and Cp5, to which p1, p2, p3, p4 and p5 are connected, respectively, through the multiplexers. Similarly, multiplexers MUX125, MUX126, MUX127, MUX128 and MUX129 are connected to input of Cm1, Cm2, Cm3, Cm4 and Cm5, to which m1, m2, m3, m4 and m5 are connected, through the multiplexers, respectively. The multiplexers MUX120 to MUX129 alternatively output the input of p1 to p5, m1 to m5 and the reference voltage Vref. When SUB1 is refreshed, all of MUX120 to MUX129 output Vref. The control signal Ctrl12 is input to the MUX120 to MUX129 in order to control the refreshment. Because SUB2 is structured similar to the SUB1, the description is omitted.

Figure 13:
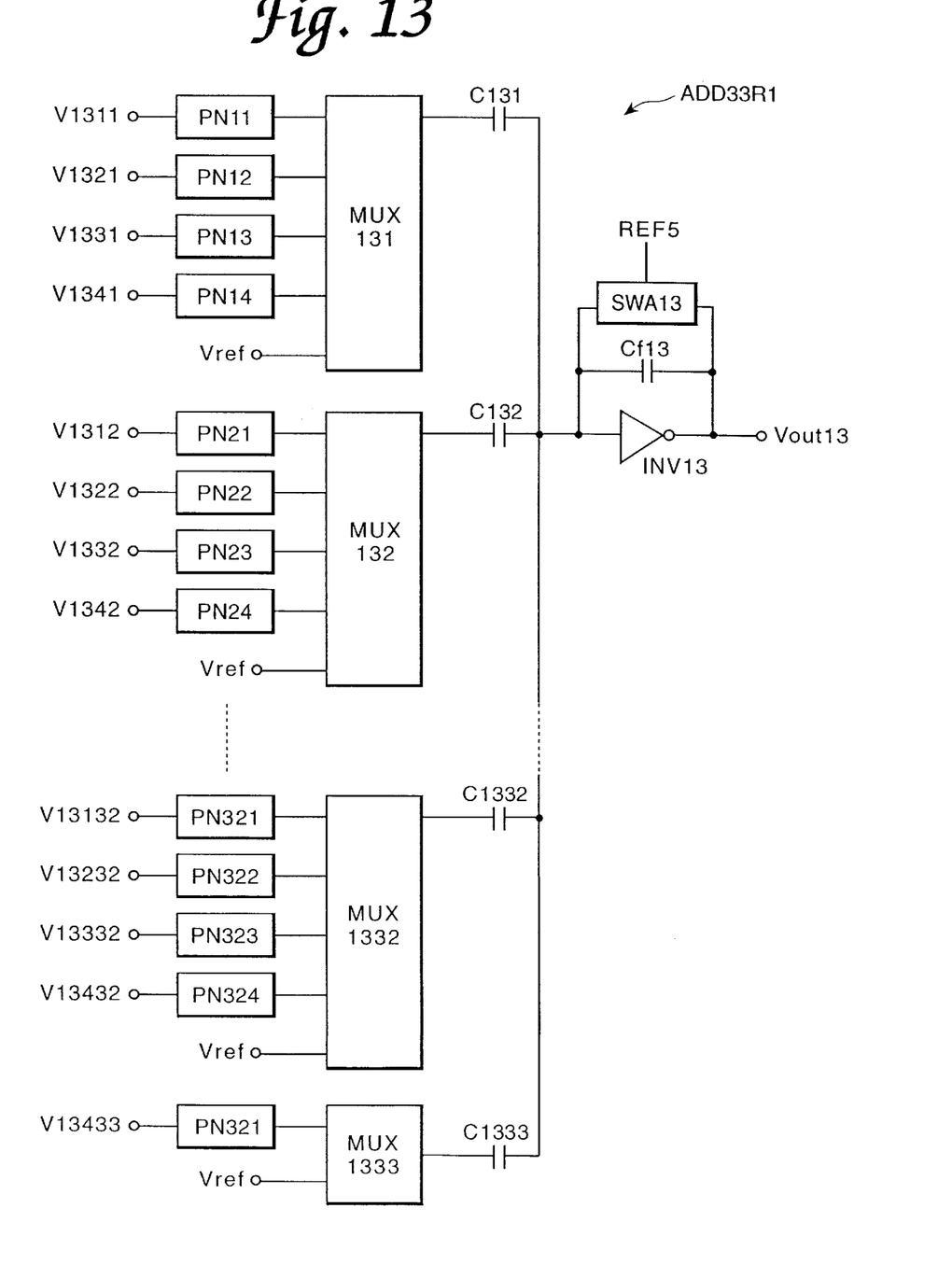
FIG. 13 shows a circuit of an auxiliary addition circuit.
Figure 18:
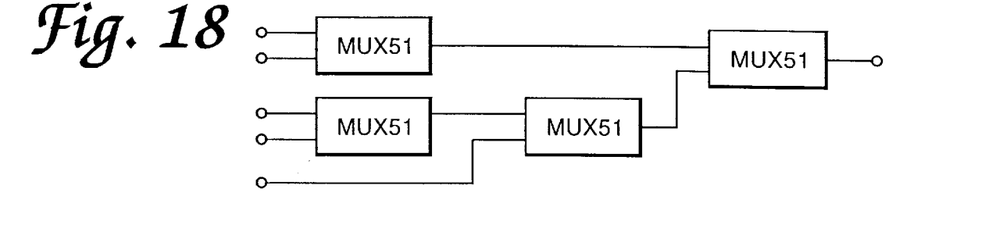
FIG. 18 shows a block diagram of a multiplexer with five inputs.

FIG. 13 shows the addition portion also known as the first auxiliary adder circuit ADD33R1, to which the following are inputted: i) V1311, V1312, ..., and V13133 which corresponding to inputs of a system 33 for being input to the ADD33-1, ii) V1321, V1322, ..., and V13232 which correspond to inputs of a system 32 for being input to the ADD32-1, iii) V1331, V1332, ..., and V13332 which correspond to inputs of a system 32 for being input to the ADD32-2, and iv) V1341, V1342, ..., and V13432 which correspond to inputs of a system 32 for being input to the ADD32-3. The first inputs to each addition portion V1311, V1321, V1331 and V1341 are inputted to a multiplexer MUX131 through respective switches PN11, PN12, PN13 and PN14 which open and close according to the PN codes. The MUX131 selects inputs for inputting an addition portion which is refreshed. For example, when the ADD33-1 is refreshed, V1311 is selected. The Vref is also input to the MUX131. The Vref is selected when ADD33R1 itself is refreshed. The multiplexers 131 to 1332 with five inputs can be easily structured by connected MUX51 by layer as shown in FIG. 18.

A multiplexer MUX132 similar to the MUX131 is settled for the second inputs of each addition portion. The circumstance is similar to it until the thirty-second input. As the thirty-third input is input to only ADD33-1, a multiplexer MUX1333 to which V13433 and Vref are the only inputs, capacitors C131, C132, ..., and C1333 are connected to outputs of the multiplexers. A capacitive coupling is structured by integrating outputs of the capacitors.

An output of the capacitive coupling is inputted to an inverter circuit INV13 including three serial MOS inverts. An output of the INV13 is fed back to its input by a feedback capacitance Cf13 so as to keep the linearity. An input and output of INV13 is connected to a switch SWA13. When refreshing is performed, the input and output of INV13 are short-circuited by closing SWA13 by a refreshing signal REF5 (described later). The capacitors C131 to C1333 have the same capacitance and the Cf13 has the capacitance equal to the total sum of the capacities of the capacitances.

Therefore, an output of ADD33R1 has the value normalized the sum of inputs. Because the second auxiliary adder circuit ADD33RS is structured similar to the ADD33R1, the description is omitted.

Figure 14:
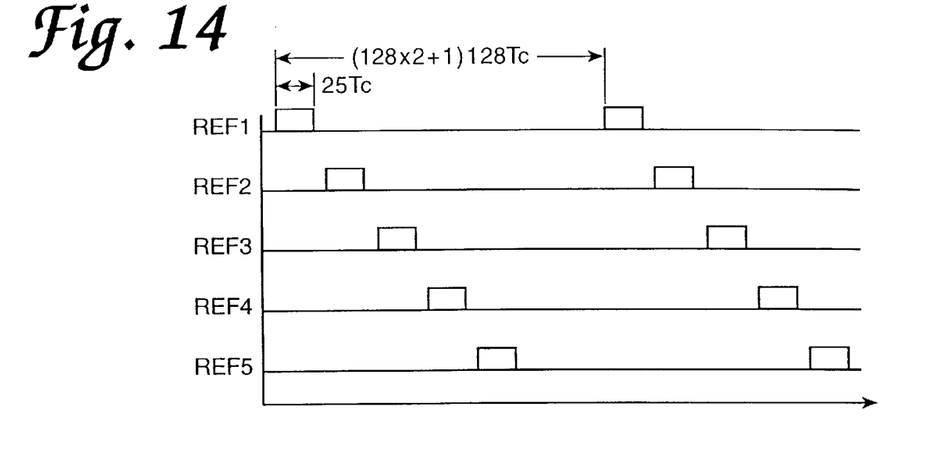
FIG. 14 is a timing chart showing timings of the refreshing operations.

FIG. 14 is a timing chart showing the timing of the refreshing operation of addition portions. A refreshing signal REF1 is for ADD33-1 and ADD33-2, a refreshing signal REF2 is for ADD32-1 and ADD32-4, a refreshing signal REF3 is for ADD32-2 and ADD32-5, a refreshing signal REF4 is for ADD32-3 and ADD32-6, and a refreshing signal REF5 is for ADDR1 and ADDR2. The refreshing operations are repeated in the order of REF1, REF2, REF3, REF4 and REF5. As the shortest time of one refreshment is known to be 25 Tc, the time of refreshment in FIG. 4 is settled to be 25 Tc, or it may be more. It is known that the internal of refreshing for an addition potion can be long. Considering it and in order to be an enough interval, it is settled to be $\{(2\times128+1)\times128\}\cdot Tc$, when the number of taps of a matched filter is 128.

Figure 15:
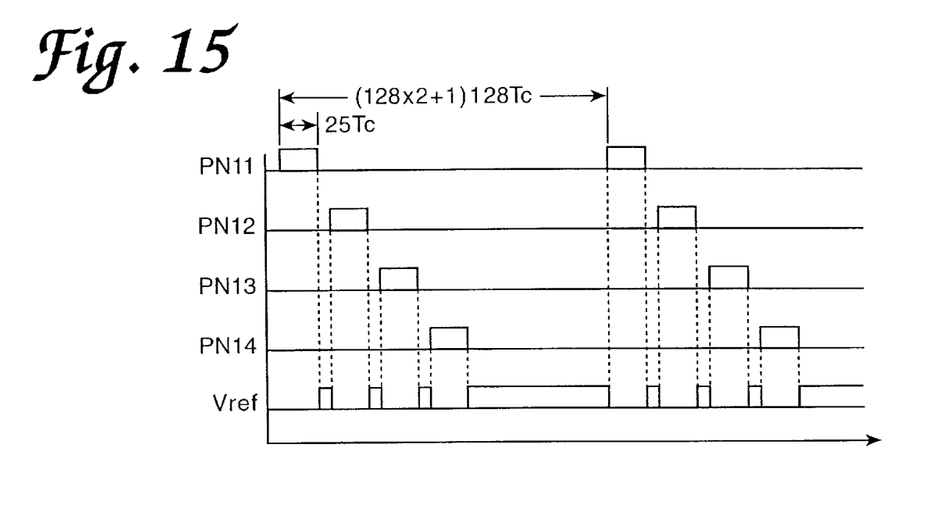
FIG. 15 is a timing chart showing timings of an auxiliary addition circuit.

The control timing of a multiplexer in the first auxiliary adder ADD33R1 is shown in FIG. 15. In the figure, giving an example of MUX131, the timing for inputting inputs to ADD33-1, ADD32-1, ADD32-2 and ADD32-3 are PN11, PN12, PN13 and PN14, respectively. The timings for refreshing ADD33R1 is Vref. The PN11, PN12, PN13 and PN14 are the same as the timings as REF1 to REF4, respectively. The timing for refreshing are all the periods except them. It means that enough time for refreshment is settled.

Figure 16:
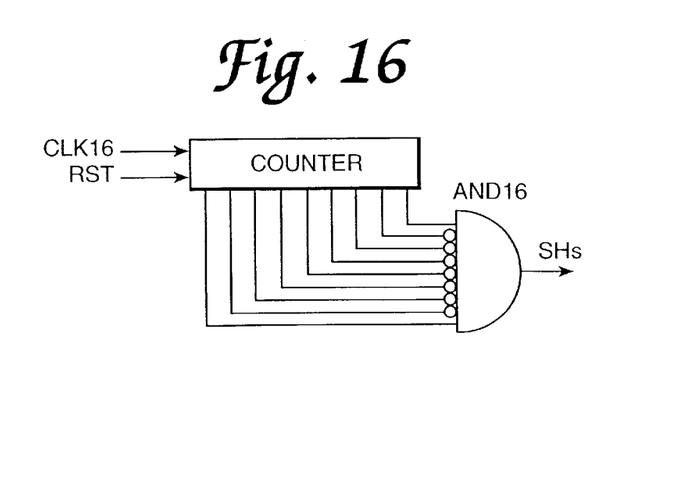
FIG. 16 shows a circuit for generating PN codes.

FIG. 16 shows a circuit for generating sampling and holding signals of SHs. A clock CLK16 generated on every sampling and holding is judged by AND1 of an AND circuit when an output of a counter of 9 bits (shown by COUNTER) is 257 (100000001 by binary number). This pulse is held until the next clock is input.

FIG. 17 is a circuit for generating PN codes used in SHs. A logical multiplication of SHi and PNi is generated as a PN code of SHs. Therefore, outputs of 128 of AND gates AND171, AND172, ... AND17128 to which PN1 and SH1, PN2 and SH2, and PN128 and SH128 are input, respectively, are input to OR17 of an OR gate. The output of OR17 is the PN code of SHs.

Figure 21:
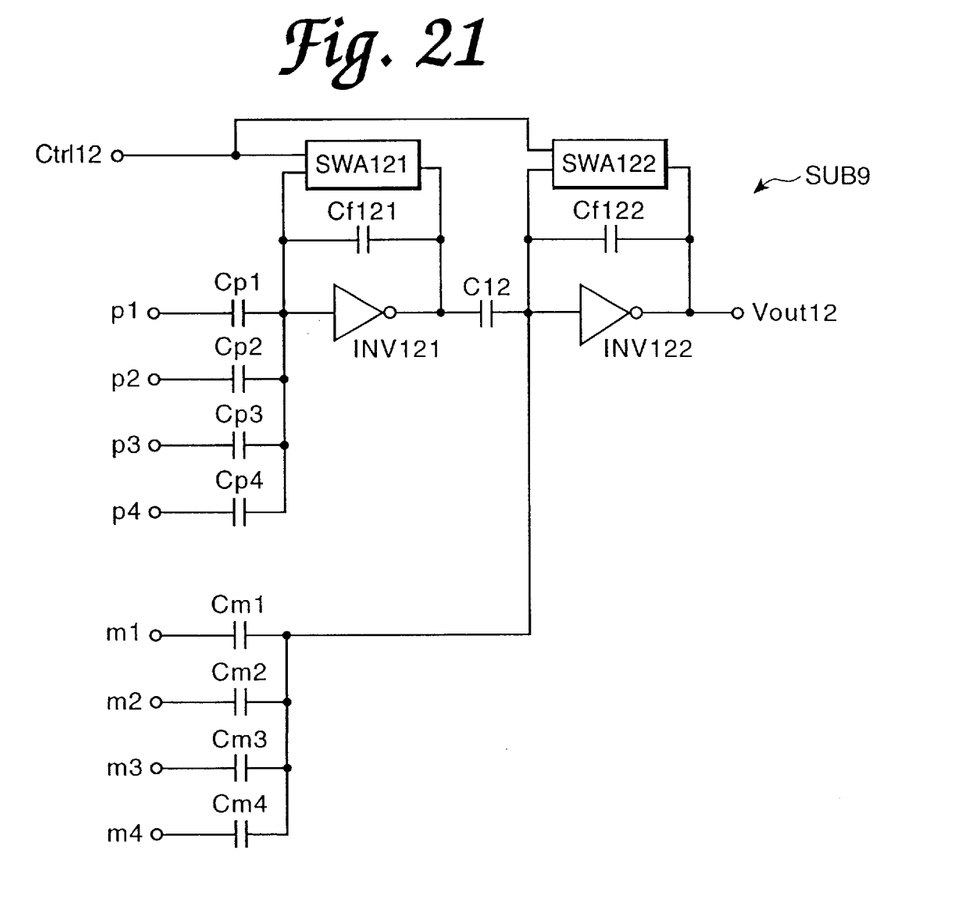
FIG. 21 shows a circuit of a subtraction circuit.

In FIG. 21, the subtracter SUB9 includes a capacitive coupling in which four capacitors Cp1, Cp2, Cp3, Cp4 for adding outputs of ADD33-1, ADD32-1, ADD32-2 and ADD32-3 (shown by p1, p2, p3 and p4 in the figure). An output of the capacitive coupling is connected to an inverter circuit INV121 consisting of a three-stage MOS inverter. An output of INV121 is fed back to its input by a feedback capacitance Cf121, for good linearity. An inverter circuit INV122 similar to INV121 is connected to the following stage to the INV122 through a capacitor C12. A capacitive coupling consisting of capacitances Cm1, Cm2, Cm3 and Cm4 is connected to INV122. A feedback capacitance Cf122 is also connected to INV122. Minus outputs of ADD33-2, ADD32-4, ADD32-5 and ADD32-6 (shown by m1, m2, m3 and m4) are input to the capacitances, and the addition result of them are output. An output of INV121 is the inverse of addition result of p1 to p4. INV121 is added to the summation of m1 to m4 in C12 and the capacitive coupling including Cm1 to Cm4. As the addition result is inverted by INV122, a subtraction value of the addition result of m1 to m4 from the addition result of p1 to p4 is generated as Vout 12 of the output of INV122. The ratio of the capacitance of capacitors of Cp1 to Cp4 and of Cf121 is 1:4. For example, when equal input voltages are impressed on Cp1 to Cp4, INV121 outputs a voltage equal to each input voltage. The capacitance ratio of each capacitance of Cm1 to Cm4, capacitance C12 and Cf122 is 1:4:4. Inputs of Cp1 to Cp4 and of Cm1 to Cm4 are equally weighted. For example when all inputs have the same value of plus, the last output Vout12 is equal to the input. On the other hand when they have the same value of minus, the Vout 12 is a voltage symmetrically inverted on the axis of the reference voltage. INV121 and INV122 are connected by switches for refreshing SWA121 and SWA122, and controlled by a control signal Ctrl12.

Figure 22:
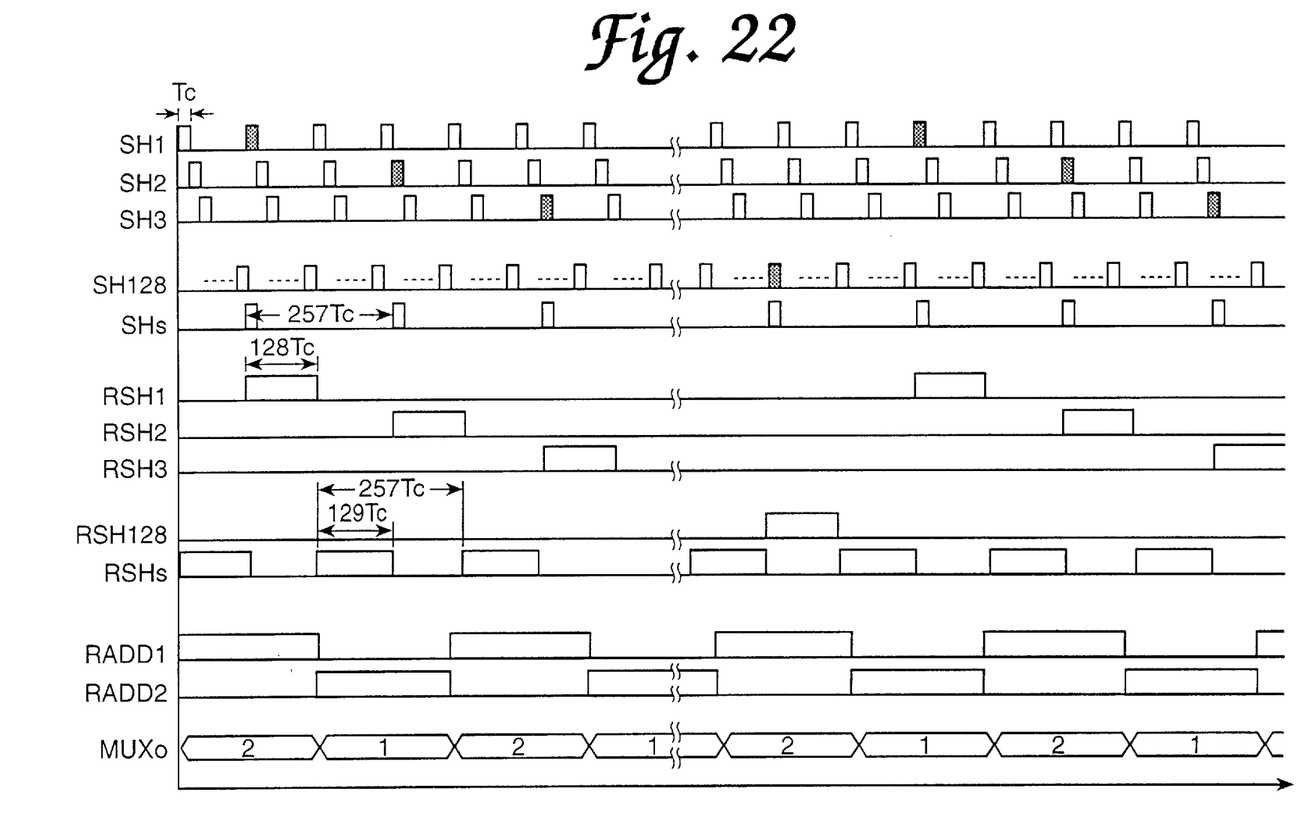
FIG. 22 shows timings of refreshing operations for the sampling and holding circuits.

As in FIG. 22, the matched filter above intermittently refreshes sampling and holding circuits as well as successively performs sampling and holding an analog input in a sampling and holding circuit. In the figure, SH1 to SH128 show the timings of each unit sampling and holding circuit of SH1 to SH128, and Shs shows the timings of sampling of auxiliary sampling and holding circuits. The period Tc of one sampling is enough time for charging capacitances in a sampling and holding circuit (Cin4 and Cf4 in FIG. 4). The sampling and holdings are successively performed by SH1 to SH128 in the first period. The broken line shown before SH128 indicates the omission of the period of SH4 to SH127. Sampling and holding by auxiliary sampling and holding circuits SHs are performed after that. If the sampling and holding were performed in the same timing as the first period, SH1 would perform sampling and holding, however SH1 is stopped. The timings of refreshing of SH1 to SH128 are shown by RSH1 to RSH128. As shown by RSH1, SH1 is refreshed during its stops. In the third period, samplings are performed again by all the sampling and holding circuits from SH1 to SH128. The main sampling and holding circuit is not refreshed. In the fourth period, SH2 stops and the auxiliary sampling and holding circuit SHs is used instead of it, at the same time, SH2 is refreshed. One of SH3 to SH128 successively stops and is refreshed by every other period. Shs are used instead of the stopped sampling and holding circuit. When Tc is deemed as unit time, the holding time of SHs is Tc, and the period of them is 257 Tc. The holding time of RSH1 to RSH128 is 128 Tc, and the period of them is 257×128 Tc.

The cycle of the sampling and holding circuit should be settled so that the error of output voltage caused by current leak does not exceed the permissible value. The errors caused by the current leaks in INV4 (FIG. 4) and INV5 (FIG. 5), which are known from experience should be considered. In order to simplify the total control of the circuit, as shown in FIG. 22, the sampling and holding circuit in the main sampling and holding circuit should be refreshed by the unit period of symbolic cycle (2 symbolic cycles in FIG. 22). In FIG. 22, the cycle is correctly (2 symbolic cycles+1 chip time) because the sampling and holding circuit to be refreshed is shifted one after another. Each sampling and holding circuit in the main sampling and holding circuit is successively refreshed. For example after SH1 is refreshed, SH2 is refreshed next. Though in this case, the refresh cycle does not strictly coincide with the symbolic cycle, the symbolic cycle unit Ts can be used. Assuming that the approximate natural number of the interval of refreshments between a sampling and holding circuit and the next one is Ts [symbolic cycle], the number of taps of a matched filter is N, the chip time is Tc[sec], the change of voltage caused by current leak in the inverter per a unit time is Lv [V/sec], Td [sec] of the interval from a refreshment to the next refreshment with respect to one sampling and holding circuit is as in formula (2).

$$Td = N(Ts \cdot N + 1)Tc \qquad (2)$$

Assuming that the permissive error due to a current leak is Ev [V], the formula (3) should be satisfied.

$$Td \cdot Lv < Ev \qquad (3)$$

From above, the following relationship (4) can be obtained.

$$Ts < \left( \frac{Ev}{NTcLv} - 1 \right) \frac{1}{N} \qquad (4)$$

Ts should be settled to be the maximum value because the electric power consumption increases as the frequency of refreshment becomes higher.

The auxiliary sampling and holding circuits Shs are refreshed just before the sampling and holding. The timing of refreshment of SHs in FIG. 22 is shown by RSHs. The continuous time of RSHs is 129 Tc, and the cycle of it is 257 Tc.

Though a sampling and holding circuit cannot generate an effective output unless data with N number of taps are effectively held, a chip time and any points are not limited because the addition and subtraction circuit can generate an effective output when one of the two works. Also in the addition and subtraction circuits, the current leakage of INV10 (FIG. 10), INV11 (FIG. 11) and INV121, INV122 (FIG. 21) is important. While one of the addition and subtraction circuit is used, another one is refreshed. As shown in FIG. 22 by RADD1 and RADD2, ADD1 and ADD2 are alternatively refreshed. The continuous time of RADD1 and RADD2 and the cycle of them are 256 Tc and 512 Tc, respectively. A multiplexer MUXo selects outputs of working addition and subtraction circuit and always outputs effective data as Aout.

Figure 23:
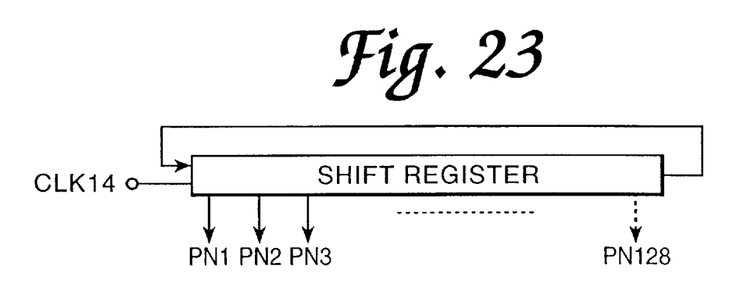
FIG. 23 shows the circulation of PN codes from PN1 to PN128.

The PN codes for multiplying an analog input voltage are used by every period in rotation. The PN code for each unit sampling and holding circuit is stored in a shift register as shown in FIG. 23. A clock CLK14 is input to the shift register by one period of sapling and holding. The PN codes are shifted on every input. The PN code which has reached the end of the sift register is then transferred back to the start end. In the figure, the PN code for giving SH1, SH2, SH3, . . ., SH128 are shown by PN1, PN2, PN3, . . . , PN128.

Figure 24:
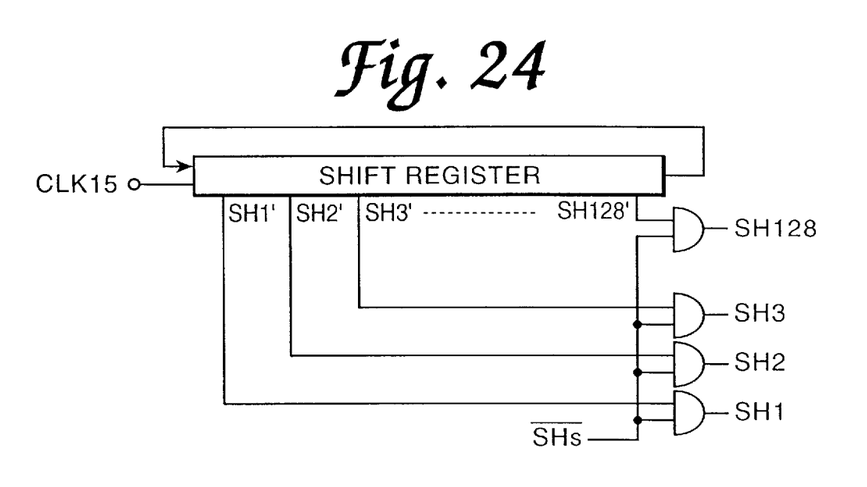
FIG. 24 shows a shift-register.

The signal for making each unit sampling and holding circuit performs sampling and holding consists of one signal of 1 and 127 signals of 0. The sampling and holding circuit to which the signal 1 is input performs sampling and holding. The signal is stored in a shift-register in FIG. 24. The sampling and holding is performed by rotating the signal as in FIG. 23. The shift-register is also driven by a clock CLK15 similar to the CLK14. At the timing that the auxiliary sampling and holding circuits are charged, as the sampling and holding have to be stopped, NOT of SHs and AND of each sampling and holding signal is the final sampling and holding signal. In the FIG. 24, SH1 to SH128 are the final sampling and holding signal, and SH1' to SH128' are the signals of a predetermined period before AND is executed on auxiliary sampling and holding circuits.

As mentioned above, the first and second addition circuits of a matched filter of the present invention are arranged into a plurality of groups, the first and second auxiliary adders replace functions of groups of the first and second adders, respectively, outputs of the first and second adders are inputted to the first and second subtractors, respectively and, the refreshing means appropriately refreshes groups replaced by the first and second auxiliary adders. Therefore, it is possible to refresh the entire circuit while keeping the speed of calculation comparable to a small-sized circuit.

Moreover, the matched filter according to the present invention, decreases the number of auxiliary sampling and holding circuit to one, and decides the intervals of refreshing by considering the change of voltage caused by leak as well as the permissible error of output voltage. Therefore, it is possible to provide a matched filter which can refresh the entire circuit while keeping the speed of calculation comparable to a small-sized circuit.

What is claimed is:

1. A matched filter comprising:

i) a plurality of main sampling and holding circuits connected in parallel to an input voltage for holding said input voltage in time series, each of said sampling and holding circuits having a first and second output corresponding to a first and second value of PN code;

ii) an auxiliary sampling and holding circuit for holding an input voltage in place of said main sampling and holding circuits;

iii) a plurality of first adders for adding said first outputs of said sampling and holding circuits, said first adders arranged into a plurality of groups;

iv) a plurality of second adders for adding said second outputs of said sampling and holding circuits, said second adders arranged into a plurality of groups;

v) a first auxiliary adder for adding said first outputs of said sampling and holding circuits in place of one of said groups of said first adders;

vi) a second auxiliary adder for adding said second outputs of said sampling and holding circuits in place of one of said groups of said second adders;

vii) a first subtracter for subtracting all of the outputs of said second adders and said second auxiliary adder from all of the outputs of said first adder and said first auxiliary adder;

viii) a second subtracter or subtracting all of the outputs of said second adders and said second auxiliary adder from all of the outputs of said first adder and said first auxiliary adder; and iv) a refreshing means for refreshing said main sampling and holding circuit when said auxiliary sampling and holding circuits hold said input voltage, and for refreshing said groups of first and second adders when said auxiliary first and second adders add said first and second outputs.

2. The matched filter as set forth in claim 1, wherein said auxiliary sampling and holding circuit comprises two sampling and holding circuits each of which samples and holds said input voltage, and one of said sampling and holding circuits is refreshed while the other holds said input voltage.

3. A matched filter comprising:

i) a main sampling and holding circuit with a plurality of sampling and holding circuits parallelly connected to an input voltage for holding said input voltage in time series, each said sampling and holding circuit having first and second outputs corresponding to first and second values of PN code;

ii) the first adder for adding said first outputs of said sampling and holding circuits;

iii) the second adder for adding said second outputs of said sampling and holding circuits;

iv) the first subtraction circuit for subtracting an output of said second adder from an output of said first adder;

v) one or more auxiliary sampling and holding circuits for sampling and holding a part of said analog input voltage to be sampled and held by said sampling and holding circuit in said main sampling and holding circuit;

vi) the second addition and subtraction circuit consisting of circuits equivalent to those of said addition and subtraction circuit;

vii) a multiplexer for alternatively outputting an output of either said first or second addition and subtraction circuit; and viii) a refreshing means for refreshing said sampling and holding circuit in said main sampling and holding circuit, for which said auxiliary sampling and holding circuits hold said analog input voltage, and for refreshing said first or second addition and subtraction circuit not selected by said multiplexer, wherein outputs of said sampling and holding circuit and said auxiliary sampling and holding circuit are input in both of said first and second addition and subtraction circuits, said number of said auxiliary sampling and holding circuit is one, each sampling and holding circuit is successively refreshed, and said matched filter is structured so as to satisfy the formula (1) below, assuming an approximate natural number of an interval of a refreshment of a sampling and holding circuit to be Ts [a symbolic cycle], a number of taps of said matched filter to be N, a chip time to be Tc [sec], a change of voltage caused by a leak in each sampling and holding circuit to be Lv [V/sec], and a permissible error to be Ev [V]

$$Ts < \left( \frac{Ev}{NTcLv} - 1 \right) \frac{1}{N} . \qquad (1)$$

4. A matched filter s claimed in claim 1, wherein said interval of refreshment is settled as wide as possible within a range of said formula (1).

* * * * *